(12) United States Patent
Hong et al.

(10) Patent No.: US 9,972,597 B2
(45) Date of Patent: May 15, 2018

(54) METHOD OF BONDING WITH SILVER PASTE

(71) Applicant: HYUNDAI MOTOR COMPANY, Seoul (KR)

(72) Inventors: Kyoung-Kook Hong, Hwaseong-si (KR); Hyun Woo Noh, Seoul (KR); Youngkyun Jung, Seoul (KR); Dae Hwan Chun, Gwangmyeong-si (KR); Jong Seok Lee, Suwon-si (KR); Su Bin Kang, Busan (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 0 days. days.

(21) Appl. No.: 14/800,613

(22) Filed: Jul. 15, 2015

(65) Prior Publication Data

US 2016/0141266 A1 May 19, 2016

(30) Foreign Application Priority Data

Nov. 14, 2014 (KR) ........................ 10-2014-0158778

(51) Int. Cl.
*B23K 31/00* (2006.01)
*B23K 35/00* (2006.01)
(Continued)

(52) U.S. Cl.
CPC ............ *H01L 24/83* (2013.01); *B23K 20/026* (2013.01); *B23K 20/16* (2013.01); *B23K 20/233* (2013.01); *B23K 35/025* (2013.01); *B23K 35/264* (2013.01); *B23K 35/3006* (2013.01); *H01L 24/13* (2013.01); *H01L 24/16* (2013.01); *H01L 24/29* (2013.01); *H01L 24/32* (2013.01); *H01L 24/81* (2013.01); *H05K 3/3463* (2013.01); *B23K 2201/42* (2013.01); *B23K 2203/166* (2015.10);
(Continued)

(58) Field of Classification Search
CPC B23K 35/0244; B23K 35/025; B23K 35/264; H05K 3/3484; H05K 2201/0215; H05K 2201/0218; H05K 2201/0272; H05K 3/3463; B22F 1/0003; B22F 1/0059; B22F 1/025
See application file for complete search history.

(56) References Cited

U.S. PATENT DOCUMENTS

2009/0220812 A1* 9/2009 Kato ..................... B22F 1/0003
428/548

FOREIGN PATENT DOCUMENTS

JP H11-347784 A 12/1999
KR 10-2003-0096420 A 12/2003
(Continued)

OTHER PUBLICATIONS

I. Karakaya, et al., "The Ag Bi (Silver-Bismuth) System," Journal of Phase Equilibria, vol. 14, No. 4, 1993, pp. 525-530.

*Primary Examiner* — Erin B Saad
(74) *Attorney, Agent, or Firm* — McDermott Will & Emery LLP

(57) ABSTRACT

A method for bonding with a silver paste includes coating a semiconductor device or a substrate with the silver paste. The silver paste contains a plurality of silver particles and a plurality of bismuth particles. The method further includes disposing the semiconductor on the substrate and forming a bonding layer by heating the silver paste, wherein the semiconductor and the substrate are bonded to each other by the bonding layer.

7 Claims, 8 Drawing Sheets

(51) Int. Cl.
*H01L 23/00* (2006.01)
*B23K 35/02* (2006.01)
*B23K 35/26* (2006.01)
*B23K 35/30* (2006.01)
*B23K 20/02* (2006.01)
*B23K 20/16* (2006.01)
*B23K 20/233* (2006.01)
*H05K 3/34* (2006.01)
*B23K 101/42* (2006.01)
*B23K 103/16* (2006.01)

(52) U.S. Cl.
CPC ........ *H01L 2224/13294* (2013.01); *H01L 2224/13313* (2013.01); *H01L 2224/13339* (2013.01); *H01L 2224/16227* (2013.01); *H01L 2224/16505* (2013.01); *H01L 2224/29294* (2013.01); *H01L 2224/29313* (2013.01); *H01L 2224/29339* (2013.01); *H01L 2224/32227* (2013.01); *H01L 2224/32505* (2013.01); *H01L 2224/8184* (2013.01); *H01L 2224/81191* (2013.01); *H01L 2224/81192* (2013.01); *H01L 2224/81825* (2013.01); *H01L 2224/8384* (2013.01); *H01L 2224/83191* (2013.01); *H01L 2224/83192* (2013.01); *H01L 2224/83825* (2013.01); *H01L 2924/00015* (2013.01); *H01L 2924/10272* (2013.01); *H01L 2924/201* (2013.01); *H01L 2924/2075* (2013.01); *H01L 2924/20751* (2013.01); *H05K 3/341* (2013.01); *H05K 2201/10166* (2013.01); *H05K 2203/1131* (2013.01)

(56) References Cited

FOREIGN PATENT DOCUMENTS

| | | |
|---|---|---|
| KR | 10-2006-0007011 A | 1/2006 |
| KR | 10-0976026 B1 | 8/2010 |
| KR | 10-2014-0012650 A | 2/2014 |
| KR | 10-2014-0091090 A | 7/2014 |
| KR | 10-2014-0119248 A | 10/2014 |
| WO | 2014-082100 A1 | 5/2014 |

* cited by examiner

METHOD OF BONDING WITH SILVER PASTE

CROSS-REFERENCE TO RELATED APPLICATION

This application claims the benefit of priority to Korean Patent Application No. 10-2014-0158778 filed in the Korean Intellectual Property Office on Nov. 14, 2014, the entire contents of which are incorporated herein by reference.

TECHNICAL FIELD

The present invention relates to a method of bonding with a silver paste. More specifically, the present invention relates to a method of bonding with a silver paste to bond a semiconductor device.

BACKGROUND

Following the recent trend of appliances becoming larger and having a larger capacity, the need for power semiconductor devices having a high breakdown voltage with a high current and high-speed switching is increasing. Of these, silicon carbide (SiC) semiconductor devices have a wider band gap than existing silicon (Si) semiconductor devices, and thus implement stable semiconductor characteristics even at a high temperature.

However, it is necessary to apply stable packaging materials even at a high temperature in order to obtain the effect of high-temperature operation. Particularly, current solder used to bond semiconductor devices has a melting point of lower than 230° C., and thus cannot be utilized at a bonding temperature of 250° C. at which silicon carbide semiconductor devices are eventually operated.

In order to replace the current solder, high-temperature solder or the like containing gold (Au) has recently been suggested as an alternative. However, the high-temperature solder or the like is expensive and has inferior properties such as joining strength.

In addition, a method of sintering and joining a silver (Ag) nano-particles has been suggested as a method for high-temperature bonding, but a long process at a high temperature is required, resulting in deterioration in device characteristics. A paste containing a mediator material such as glass frit has been formed to activate sintering between large-sized silver particles, but residual glass may cause an increase in resistance.

The above information disclosed in this Background section is only for enhancement of understanding of the background of the invention and therefore it may contain information that does not form the prior art that is already known in this country to a person of ordinary skill in the art.

SUMMARY

The present disclosure has been made in an effort to provide a method for bonding with a silver paste, the method having advantages of bonding a semiconductor device without necessarily using glass frit.

An exemplary embodiment of the present invention provides a method for bonding with a silver paste, the method including: coating a semiconductor device or a substrate with the silver paste, the silver paste containing a plurality of silver particles and a plurality of bismuth particles; disposing the semiconductor on the substrate; and forming a bonding layer by heating the silver paste, wherein the semiconductor and the substrate are bonded to each other by the bonding layer.

In certain embodiments, in the forming of the bonding layer, the heating may be conducted at 272° C. or higher.

In certain embodiments, in the forming of the bonding layer, the heating may be conducted at 300° C. or higher.

In certain embodiments, the forming of the bonding layer may include: heating the silver paste to transform the bismuth particles into bismuth liquids; covering surfaces of the silver particles with the bismuth liquids; causing the bismuth liquids covering the surfaces of the silver particles to contact adjacent bismuth liquids; diffusing the bismuth liquids into the silver particles; and diffusing the silver particles into the bismuth liquids to form a bonding layer in which the silver particles are joined to each other.

In certain embodiments, in the forming of the bonding layer, substantially all of the bismuth liquids may diffuse into the silver powders.

In certain embodiments, the bismuth particles may be contained in the silver paste at 10 wt % or less.

In certain embodiments, the bismuth particles may be contained in the silver paste at 5 wt % or less.

In certain embodiments, the silver particles may have a diameter within the range of 1 μm to 10 μm.

In certain embodiments, the bismuth particles may have a diameter within the range of 1 μm to 10 μm.

According to an embodiment of the present invention, the silver paste containing the silver particles and the bismuth particles can be joined by being heated at only the melting point of bismuth, thereby shortening the sintering time and enabling the use of relatively large-sized silver particles. Therefore, the time when the semiconductor device is exposed to a high temperature is shortened, thereby minimizing damage to the semiconductor device.

Furthermore, since a non-metallic sintering mediator material such as glass frit is not used, the electrical resistance can be reduced.

DETAILED DESCRIPTION

Figure 1:
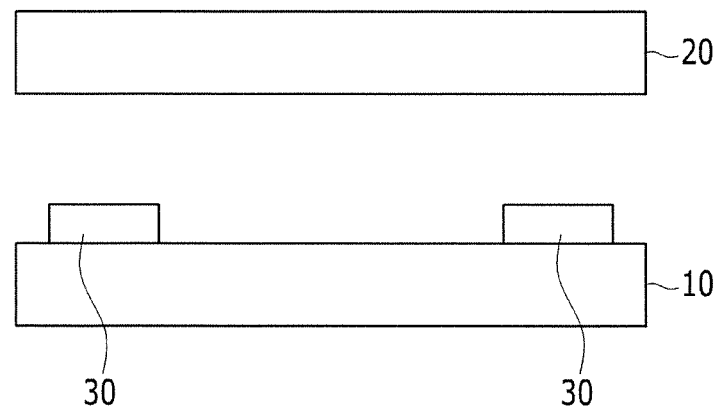
FIGS. 1 and 2 are views schematically showing a process of bonding a semiconductor device to a substrate using a silver paste.

Exemplary embodiments of the present invention will be described in detail with reference to the accompanying drawings. However, the present invention is not limited to the embodiments described herein, and thus may be embodied in many different forms.

In the drawings, the thickness of layers, films, panels, regions, etc., are exaggerated for clarity. Further, it will be understood that when a layer is referred to as being "on" another layer or a substrate, it may be formed directly on another layer or the substrate or a third layer may be interposed therebetween. Throughout the specification, like numerals substantially refer to like components.

Now, a method for bonding with a silver paste according to an exemplary embodiment of the present invention will be described with reference to FIGS. 1 to 8.

Figure 2:
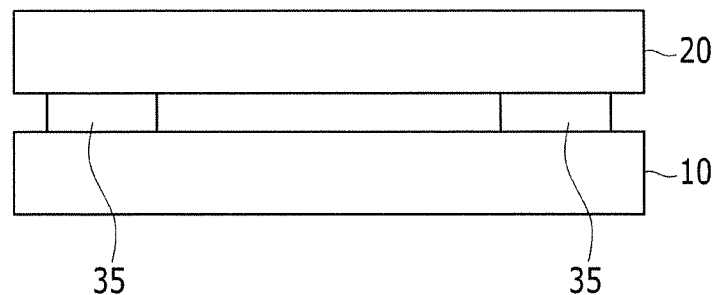

FIGS. 1 and 2 are views schematically showing a process of bonding a semiconductor device to a substrate using a silver paste.

Referring to FIGS. 1 and 2, after a silver paste 30 is coated on a substrate 10, a silicon carbide (SiC) semiconductor device 20 is disposed on the substrate 10 coated with the silver paste 30, and then the silver paste 30 is heated and sintered to form a bonding layer 35. Hence, the semiconductor device 20 and the substrate 10 are bonded to each other through the bonding layer 35. The silver paste 30 is coated on the substrate 10 in the present exemplary embodiment, but the present invention is not limited thereto. For example, in certain embodiments, the silver paste 30 may be coated on the semiconductor device 20 before the silver paste 30 is heated and sintered.

Hereinafter, a silver paste and a method of bonding with a silver paste according to an exemplary embodiment of the present invention will be described in detail.

Figure 3:
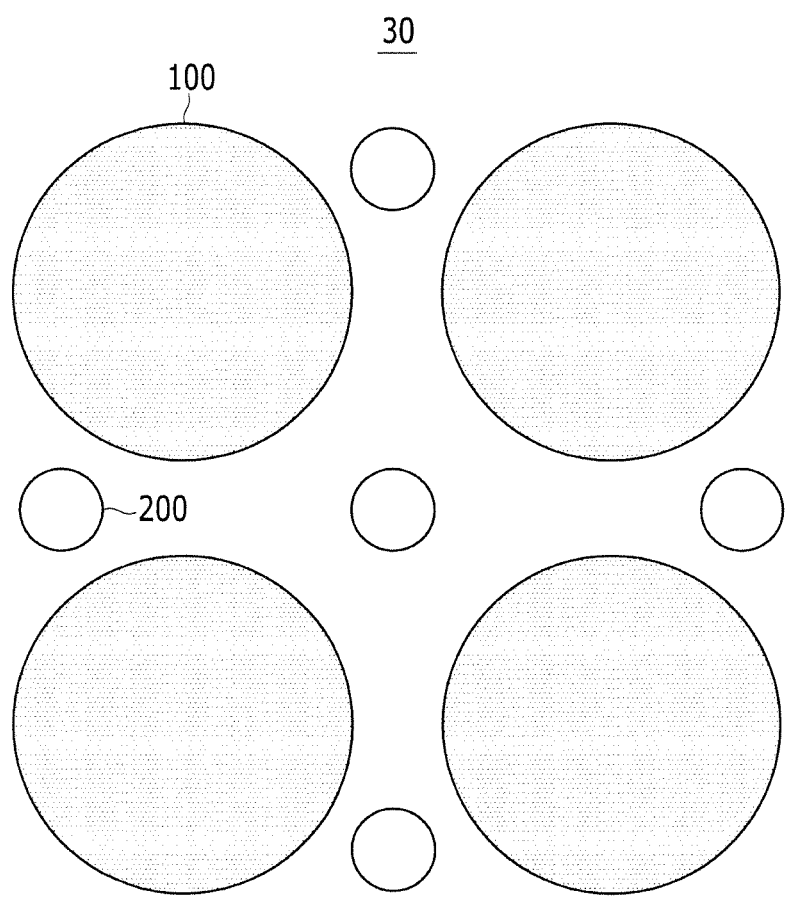
FIG. 3 is a view schematically showing a silver paste according to an exemplary embodiment of the present invention.

FIG. 3 is a view schematically showing a silver paste according to an exemplary embodiment of the present invention.

Referring to FIG. 3, a silver paste 30 according to the present exemplary embodiment contains a plurality of silver particles 100 and a plurality of bismuth (Bi) particles 200. In certain embodiments, the silver particles 100 and the bismuth particles 200 may each have a diameter of 1 μm to 10 μm.

In certain embodiments, the bismuth particles 200 may be contained in the silver paste 30 at 10 wt % or less. In certain embodiments, the bismuth particles 200 may be contained in the silver paste 30 at 5 wt % or less. When the bismuth particles 200 are contained in the silver paste 30 at more than 10 wt %, at the time of sintering the silver paste 30, the heating temperature may increase or the bismuth ingredient may remain on the bonding layer 35, causing bonding to be difficult.

FIGS. 4 to 8 are views sequentially showing a method for bonding with a silver paste according to an exemplary embodiment of the present invention.

Figure 4:
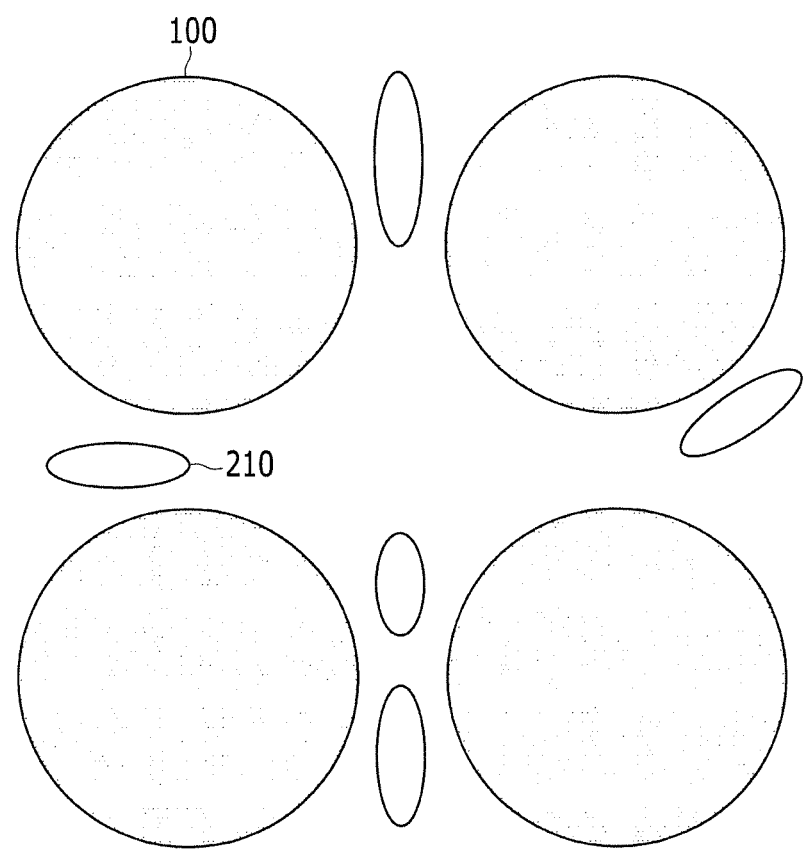
FIGS. 4 to 8 are views sequentially showing a method for bonding with a silver paste according to an exemplary embodiment of the present invention.

Referring to FIG. 4, the silver paste 30 containing the plurality of silver particles 100 and the plurality of bismuth particles 200 is heated. In certain embodiments, the heating is conducted at a temperature of 272° C. or higher. In certain embodiments, the heating is conducted at 300° C. In cases where the heating temperature is higher than the melting point of bismuth, approximately 272° C., the bismuth particles 200 melt into bismuth liquid 210. Since the melting point of silver is approximately 962° C., the silver particles 100 maintain the particle state even though they are heated to 300° C. In addition, a chemical reaction does not occur between the bismuth liquid 210 and the silver particles 100.

Figure 5:
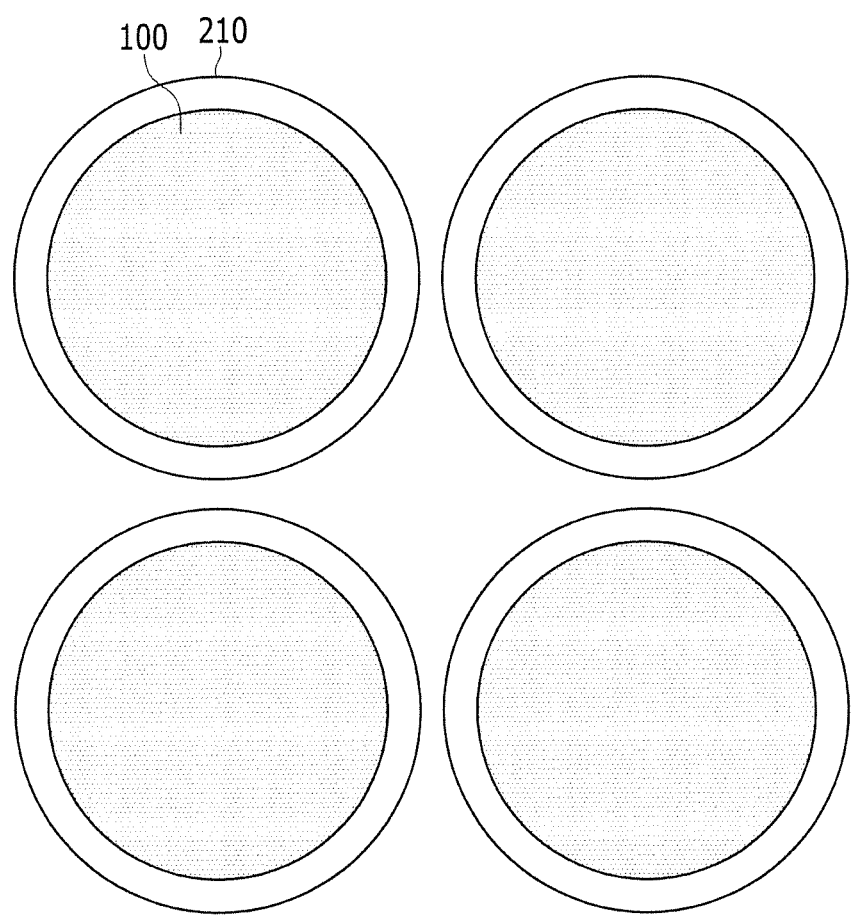
Figure 6:
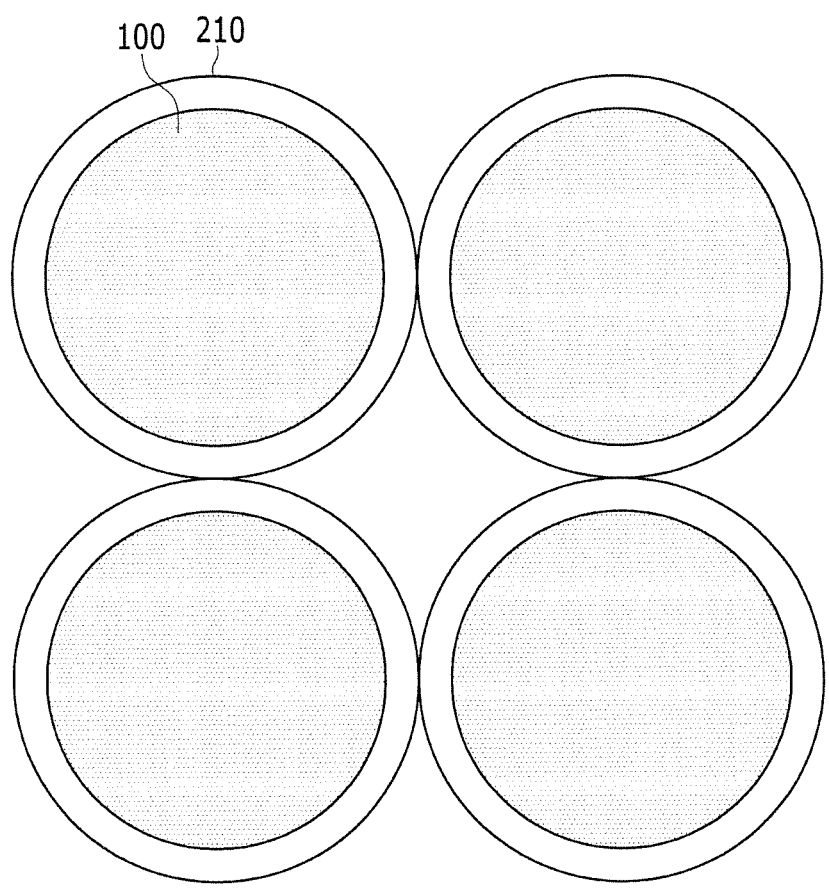

Referring to FIGS. 5 and 6, the bismuth liquid 210 is in a wetting state on a surface of each of the silver particles 100, and thus the bismuth liquid 210 covers the surface of each of the silver particles 100. The term "wetting state" refers to a change of a solid-gas interface into a solid-liquid interface since a gas contacting a surface of a solid is pushed out by a liquid.

Then, the bismuth liquid 210 covering the surface of the silver particles 100 is in contact with the neighboring bismuth liquid 210, and thus the bismuth liquids 210 covering the respective silver particles 100 contact each other.

Figure 7:
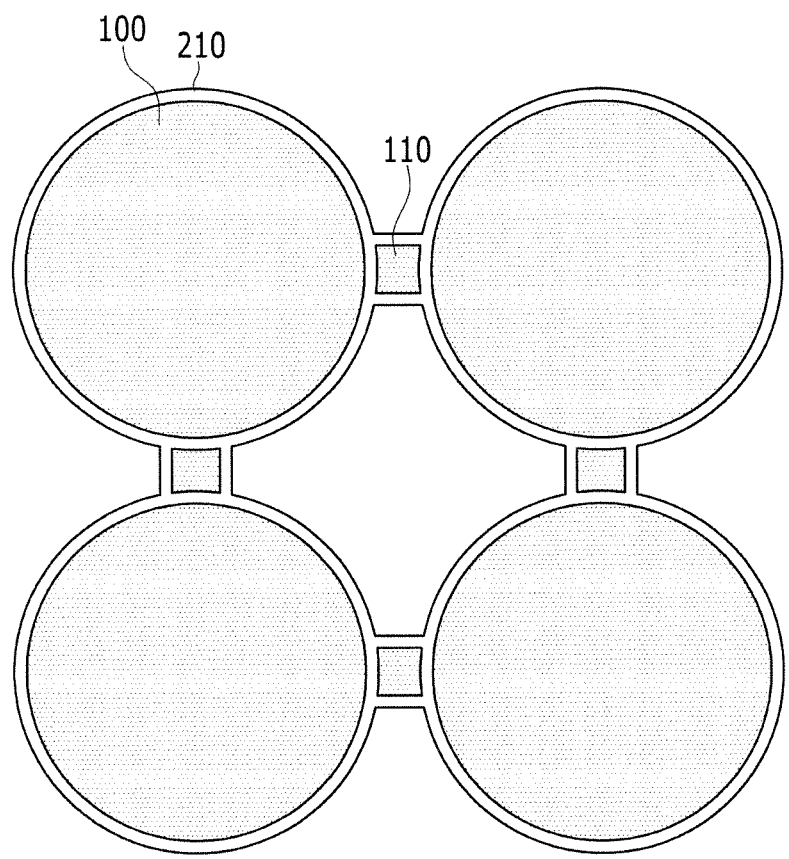

Referring to FIG. 7, the bismuth liquids 210 covering the silver particles 100 gradually diffuse into the silver particles 100 through the contact between the bismuth liquid 210 and the bismuth liquid 210. Thus, the amount of bismuth liquid 210 covering the silver particles 100 decreases. In addition, the silver particles 100 diffuse into the bismuth liquids 210, which are in contact, to form a bonding region 110 in which the respective silver particles are joined to each other.

Figure 8:
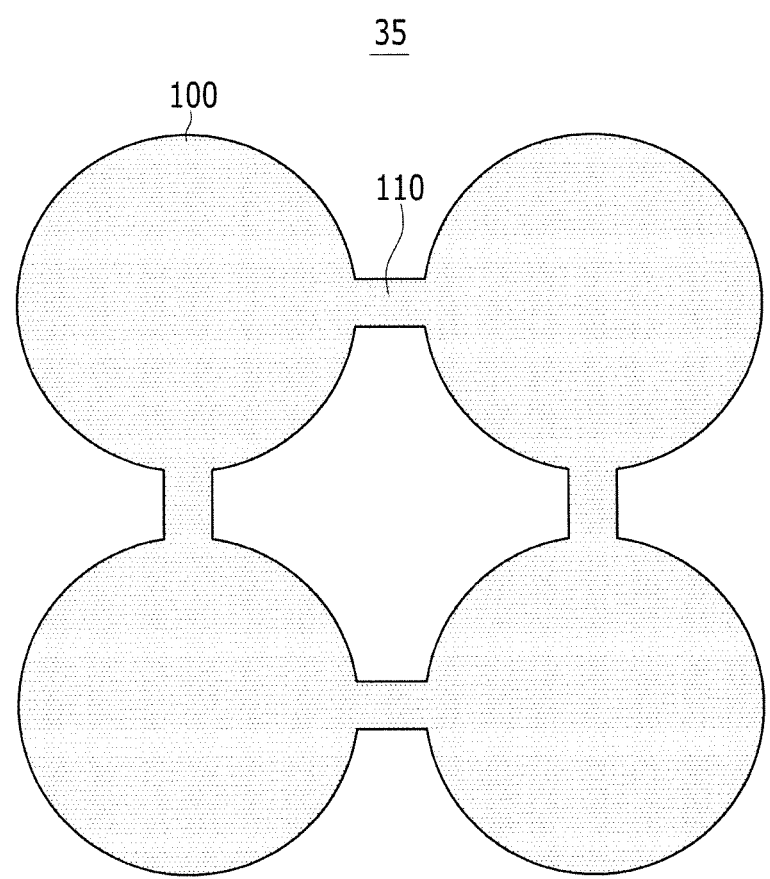

Referring to FIG. 8, substantially all the bismuth liquid 210 covering the silver particles 100 diffuses into the silver particles 100, and hence the bismuth liquid 210 substantially disappears. Thus, the respective silver particles 100 are joined to each other by the bonding region 110 to form the bonding layer 35. Therefore, the silver paste 30 according to FIG. 1 forms the bonding layer 35, and the semiconductor device 20 is bonded to the substrate 10 through the bonding layer 35.

This bonding method is called a transient liquid phase diffusion bonding method.

According to the transient liquid phase diffusion bonding method, in order to bond same metals A to each other, a metal B having a lower melting point than the metal A is positioned between metals A and then heating is conducted at a temperature higher than the melting point of the metal B, so that the metal B is liquefied to diffuse in the solid phase metal A. In certain embodiments, the metal B disappears, and the solid phase metals A are joined to each other.

In the present exemplary embodiment, silver materials are joined to each other by using bismuth, which is a metal material having a lower melting point than silver. In other words, since the melting point of silver is sufficiently higher than that of bismuth, the silver particles 100 are used for joining, and the bismuth particles 200 are an activating material for joining the silver particles 100. However, the present invention is not limited to silver and bismuth; other metals may be substituted for the joining and activating materials, as long as the melting point of the activating material is lower than that of the joining material.

As such, at the time of bonding with the silver paste 30, the diffusion of the bismuth liquid 210 into the silver particles 100 and the diffusion of the silver particles into the bismuth liquid 210 are simultaneously conducted, thereby shortening the bonding time.

Meanwhile, in the related art, the existing bonding with the silver paste is achieved by sintering, and the sintering temperature and the sintering time depend on the size of the silver particles. However, in the present exemplary embodiment, the silver particles can be bonded to each other merely by heating the silver paste at only the melting point of bismuth or higher without melting the silver particles, thereby making it possible to use relatively large-sized silver particles. In addition, at the time of heating for sintering, heating may be conducted at only the melting point of bismuth or higher, thereby shortening the sintering time and thus reducing the time when a semiconductor device is exposed to high temperature, so that damage to the semiconductor device can be minimized at the time of bonding.

Further, an existing silver paste in the related art contains a sintering mediator material such as glass frit, but this sintering mediator material is not a metal material, causing the increase in electrical resistance. However, in the present exemplary embodiment, the bismuth particles are used as an activating material for joining the silver particles without using the sintering mediator material, thereby reducing the electrical resistance.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for bonding with a silver paste, the method comprising:

coating a semiconductor or a substrate with the silver paste, the silver paste comprising a plurality of silver particles and a plurality of bismuth particles;

disposing the semiconductor on the substrate; and forming a bonding layer by heating the silver paste, wherein the semiconductor and the substrate are bonded to each other by the bonding layer, wherein the forming of the bonding layer comprises:

heating the silver paste to transform the bismuth particles into bismuth liquids;

covering surfaces of the silver particles with the bismuth liquids;

causing the bismuth liquids covering the surfaces of the silver particles to contact adjacent bismuth liquids;

diffusing the bismuth liquids into the silver particles while also diffusing the silver particles into the bismuth liquids to form a bonding region in which the silver particles are joined to each other, and wherein in the forming of the bonding layer, substantially all of the bismuth liquids diffuse into the silver particles, and wherein the bismuth liquid substantially disappears.

2. The method of claim 1, wherein in the forming of the bonding layer, the heating is conducted at 272° C. or higher.

3. The method of claim 2, wherein in the forming of the bonding layer, the heating is conducted at 300° C. or higher.

4. The method of claim 1, wherein the bismuth particles are contained in the silver paste at 10 wt % or less.

5. The method of claim 4, wherein the bismuth particles are contained in the silver paste at 5 wt % or less.

6. The method of claim 1, wherein the silver particles have a diameter within the range of 1 μm to 10 μm.

7. The method of claim 1, wherein the bismuth particles have a diameter within the range of 1 μm to 10 μm.

* * * * *